United States Patent
Leija et al.

(10) Patent No.: US 7,082,031 B2
(45) Date of Patent: Jul. 25, 2006

(54) HEATSINK DEVICE AND METHOD

(75) Inventors: Javier Leija, Chandler, AZ (US); Ioan Sauciuc, Phoenix, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 234 days.

(21) Appl. No.: 10/676,230

(22) Filed: Sep. 30, 2003

(65) Prior Publication Data

US 2005/0068737 A1    Mar. 31, 2005

(51) Int. Cl.
*H05K 7/20*    (2006.01)
(52) U.S. Cl. .................. 361/700; 62/3.2; 62/259.2; 165/104.33; 361/703
(58) Field of Classification Search ........... 29/890.032; 165/80.3, 104.33, 185; 62/3.2, 3.3, 259.2; 361/700–704, 710
See application file for complete search history.

(56) References Cited

U.S. PATENT DOCUMENTS

| | | | |
|---|---|---|---|
| 6,502,173 B1 * | 12/2002 | Aleksic et al. | ............... 711/168 |
| 6,708,501 B1 * | 3/2004 | Ghoshal et al. | ............... 62/3.7 |
| 2003/0081385 A1 * | 5/2003 | Mochizuki et al. | ......... 361/704 |
| 2005/0098300 A1 * | 5/2005 | Kawabata et al. | ......... 165/80.3 |

* cited by examiner

*Primary Examiner*—Gregory Thompson
(74) *Attorney, Agent, or Firm*—Schwegman, Lundberg, Woessner & Kluth, P.A.

(57) ABSTRACT

A method and device for thermal conduction is provided. Devices and methods are shown that include the ability to dissipate increased amounts of heat due to the use of an active heat transfer device. Devices and methods are shown that share the necessary heat transfer between a passive heat transfer device and an active heat transfer device, thus increasing the amount of heat dissipated while maintaining reliability of the individual components. Devices and methods are shown that include an increased length of the heatsink which can keep large temperature differences between heat transfer structures and the heat transfer fluid such as air.

26 Claims, 6 Drawing Sheets

HEATSINK DEVICE AND METHOD

TECHNICAL FIELD

The present invention relates generally to the field of heat transfer and, in particular, the present invention relates to thermal management of electronic devices.

BACKGROUND

In one aspect of heat transfer technology, heatsinks are used to transfer heat generated by electronic devices or groups of devices, such as transistors, as are commonly included on integrated circuit (IC) chips such as processor chips.

In the field of electronic systems there is an incessant competitive pressure among manufacturers to drive the performance of their equipment up while driving down production costs. This is particularly true regarding forming electronic devices such as transistors in IC's, where each new generation of IC must provide increased performance, particularly in terms of an increased number of devices and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments.

With the advent of high performance IC's and their associated packages, electronic devices have required more innovative thermal management to dissipate heat. Increasing speed and power in processors, for example, generally carry with it a "cost" of increased heat in the microelectronic die that must be dissipated. What is needed is a device and method to more effectively cool microelectronic dies containing IC's such as processors.

DETAILED DESCRIPTION

In the following detailed description of the invention reference is made to the accompanying drawings which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and electrical changes may be made, without departing from the scope of the present invention. The following detailed description is, therefore, not to be taken in a limiting sense, and the scope of the invention should be determined with reference to the appended claims, along with the full scope of equivalents to which such claims are entitled.

The term "active side" as used in this description is defined as the conventional horizontal, large plane or surface of a chip or die where electrical devices have typically been fabricated, regardless of the orientation of the chip or die. The term "back side" as used in this description is defined as a conventional horizontal, large plane or surface of a chip or die that generally does not contain active devices on its surface. The term "vertical" refers to a direction perpendicular to the horizontal as defined above. Prepositions, such as "on", "higher", "lower", "above" and "below" are defined with respect to the conventional plane or surface being on the active side of the chip or die, regardless of the orientation of the chip or die.

An example of an information handling system using processor chips and thermal management devices is included to show an example of a higher level device application for the present invention. In one embodiment, a heatsink according to one embodiment of the invention is included in an information handling system as described below.

Figure 1:
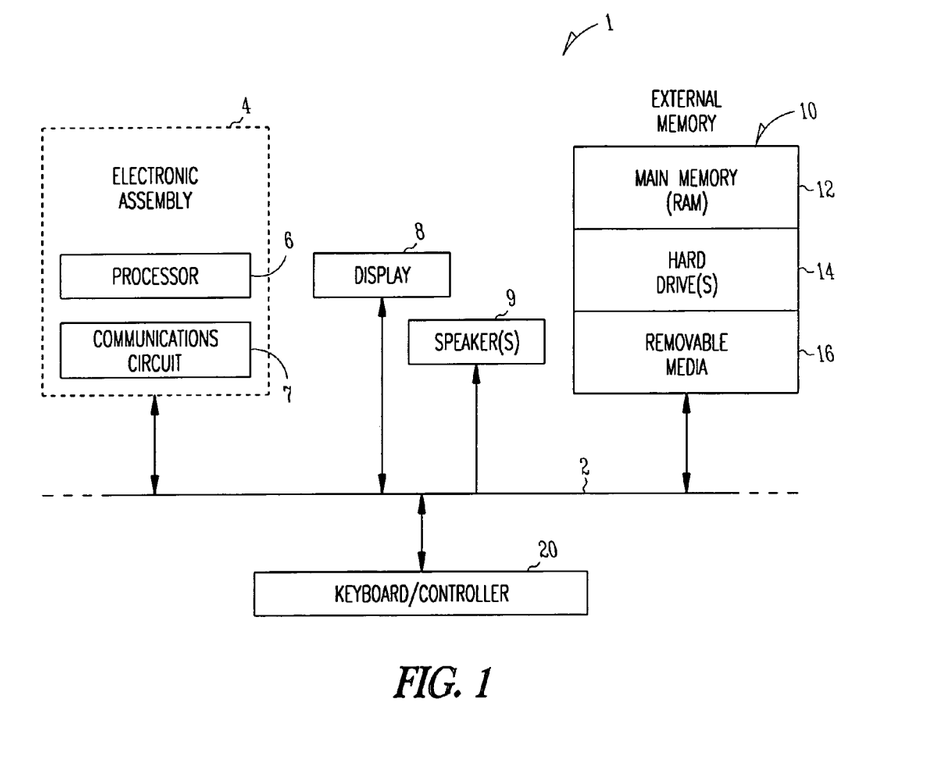
FIG. 1 illustrates an information handling device according to one embodiment of the invention.

FIG. 1 is a block diagram of an information handling system 1 incorporating at least one heatsink in accordance with at least one embodiment of the invention. Information handling system 1 is merely one example of an electronic system in which the present invention can be used. In this example, information handling system 1 comprises a data processing system that includes a system bus 2 to couple the various components of the system. System bus 2 provides communications links among the various components of the information handling system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Information handling system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CD), digital video disk (DVD), and the like. Examples of main memory 12 include dynamic random access memory (DRAM), synchronous dynamic random access memory (SDRAM) such as double data rate synchronous dynamic random access memory (DDR SDRAM) or rambus dynamic random access memory (RDRAM), flash memory, static random access memory (SRAM), etc.

Information handling system 1 can also include a display device 8, one or more speakers 9, and a keyboard and/or controller 20, which can include a mouse, trackball, game controller, voice-recognition device, or any other device that permits a system user to input information into and receive information from the information handling system 1.

Although the present invention is found to be effective at transferring heat from IC surfaces, the invention is not limited to heat transfer from IC surfaces. The invention can be used in any setting where heat is to be conducted from one surface to another. For ease of explanation, the example of cooling an IC will be used.

Figure 2A:
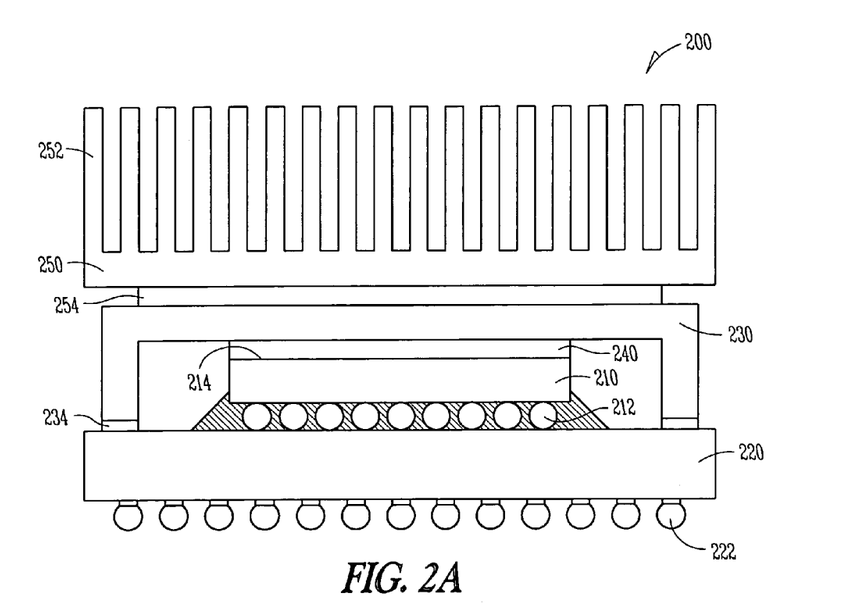
FIG. 2A illustrates a side view of a processor assembly according to one embodiment of the invention.

FIG. 2A shows a cross-sectional representation of a chip assembly 200. In embodiments where the chip is a processor die, the chip assembly can be termed a processor assembly. Chip assembly 200 includes an IC die 210 mounted in "flip-chip" orientation with its active side facing downward to couple with an upper surface of a substrate 220, such as a circuit board, through solder balls or bumps 212. Substrate 220 can be a one-layer board or a multi-layer board, and it can include additional contacts 222 on its opposite surface for mating with additional packaging structure (not shown).

Die 210 generates its heat from internal structure, including wiring traces, that are located near its active side; however, a significant portion of the heat is dissipated through its back side 214. Heat that is concentrated within the die is dissipated to a large surface that is in contact with the die in the form of an integrated heat spreader 230 that is typically formed of metal such as copper or aluminum. In one embodiment, the integrated heat spreader 230 is formed into a partial enclosure, and serves as a package cover for the die 210. In one embodiment, a sealant 234 is further included to isolate and secure the integrated heat spreader 230 to the substrate 220. To improve the thermal conductivity between the die 210 and the integrated heat spreader 230, a thermal interface material 240 is often provided between the die 210 and integrated heat spreader 230.

In one embodiment, to further dissipate heat from the integrated heat spreader 230, a heatsink 250 is coupled to the integrated heat spreader 230. In one embodiment, the heatsink 250 includes a number of fins 252. Heatsink 250 dissipates heat into the ambient environment. In one embodiment a second thermal interface material 254 is further utilized to create a thermal pathway between the integrated heat spreader 230 and the heatsink 250. In one embodiment, a device such as a fan (not shown) is connected adjacent to the heatsink 250 to circulate air and more effectively transfer heat away from the die 210.

The heatsink 250 shown in FIG. 2A is intended to be a general illustration of one application of a heatsink. In the following detailed description, specific details of heatsinks for use in configurations such as FIG. 2A are illustrated for given embodiments of the invention.

Figure 2B:
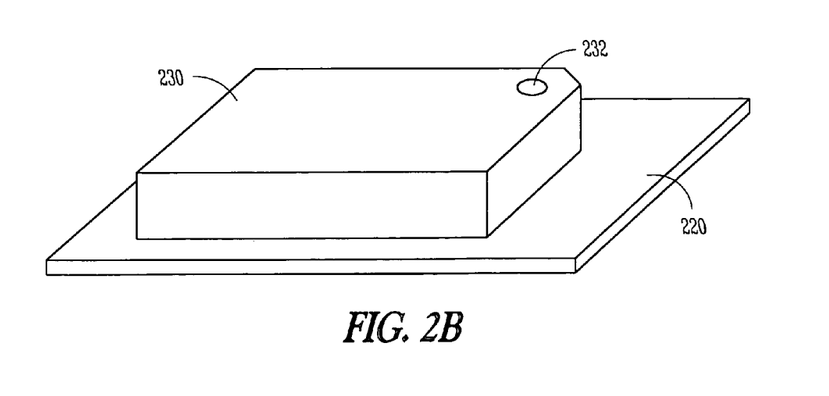
FIG. 2B illustrates an isometric view of a processor assembly according to one embodiment of the invention.

FIG. 2B shows an embodiment of an chip assembly 200 without a heatsink 250 attached as described above. The integrated heat spreader 230 is shown in an embodiment formed as a package cover. The edges of the integrated heat spreader 230 form an enclosure with the substrate 220 where the die (not shown) is substantially enclosed. In one embodiment, an opening 232 is included in the integrated heat spreader 230. In one embodiment, the opening 232 provides a relief or variations in pressure due to thermal changes in the die.

Figure 3:
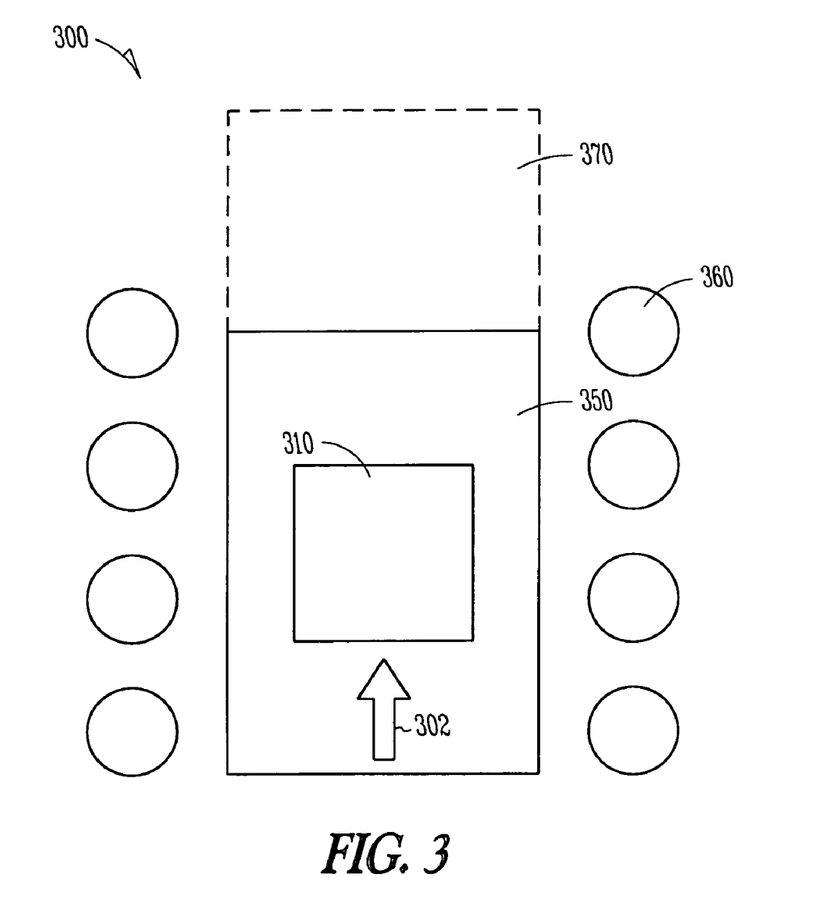
FIG. 3 illustrates a top view of a heatsink and adjacent components.

FIG. 3 shows a processor assembly 300. The processor assembly includes a processor die 310 and a heatsink 350. Although a processor die 310 is shown, other IC dies or other heat sources in general are within the scope of the invention. Although a single processor is shown, embodiments of the invention can also be used with multiple processors, multiple IC dies, multiple heat sources, etc. In operation, air flows across the heatsink 350 along direction 302 and heat is transferred from the heatsink 350 to the air where it is removed from the system. Although air is used as an example, other fluids such as other gasses, liquids, etc. can be used for heat transfer.

As shown in FIG. 3, in some configurations of a personal computer, components that are adjacent to the processor die 310 restrict a width of the heatsink 350. In one embodiment, a number of power supply components 360 restrict a width of the heatsink 350. To satisfy increased cooling needs, a geometry (and hence surface area) of the heatsink 350 can be increased. However in the illustration of FIG. 3, the width of the heatsink 350 is constrained. In one configuration, region 370 is available for expansion of the heatsink 350 which would result in a longer heatsink. However, as air travels along a long heatsink, the air becomes more and more heated, resulting in a lower and lower differential temperature between the heatsink and the air. At some length, the long heatsink is no longer effective because the differential in temperature is too small for any additional heat to be transferred from the heatsink to the air.

Figure 4A:
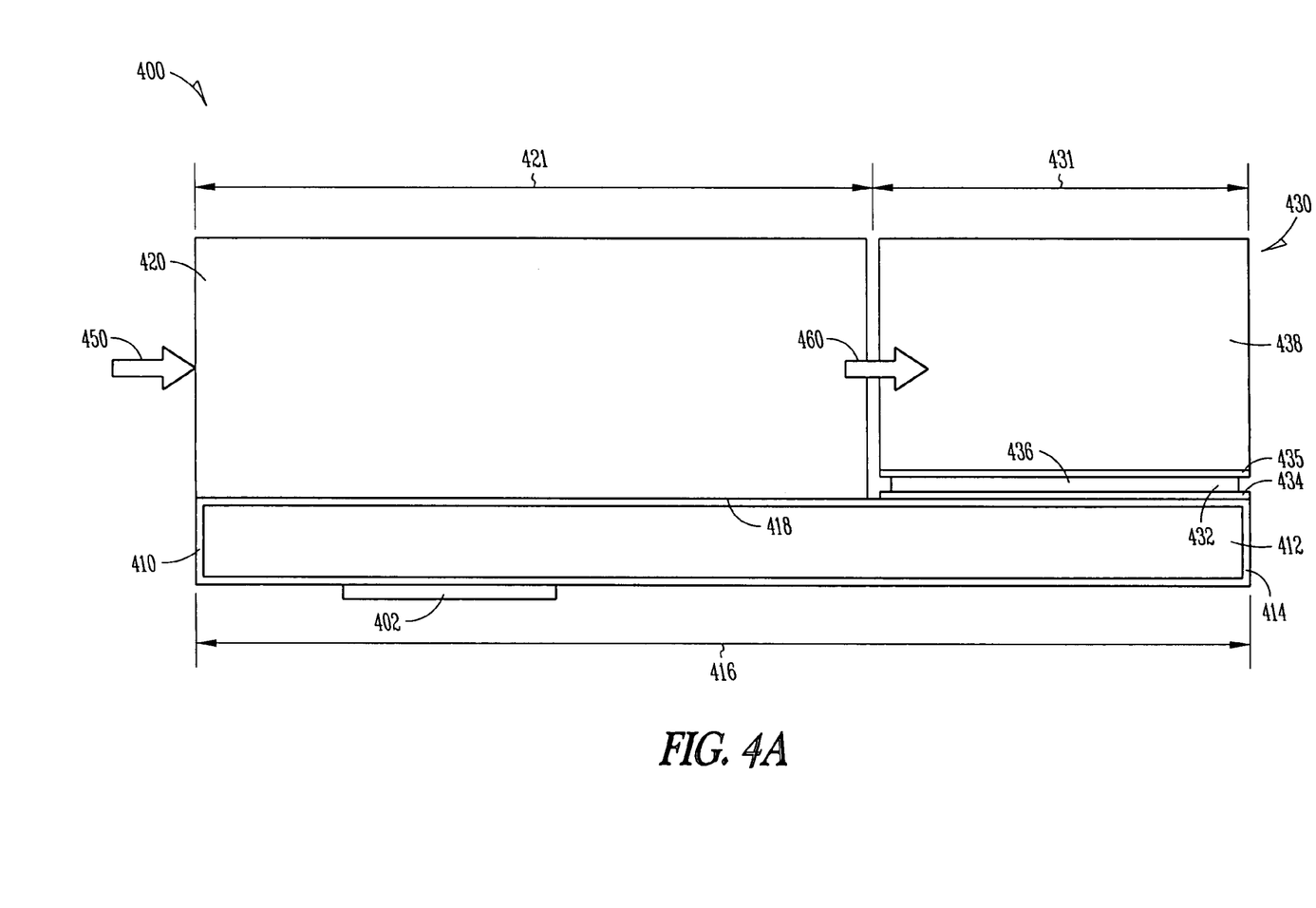
FIG. 4A illustrates a side view of a heatsink according to an embodiment of the invention.
Figure 4B:
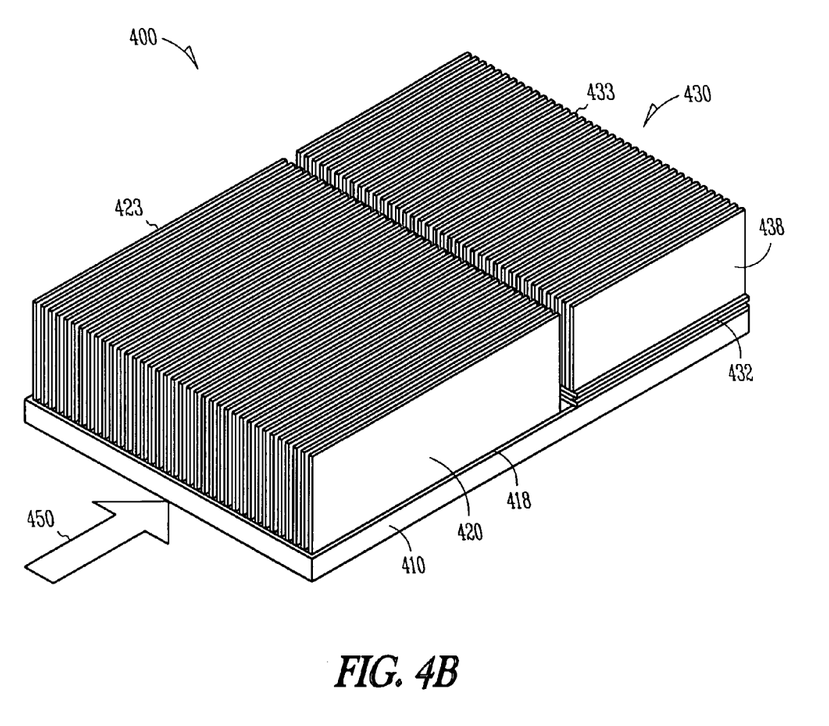
FIG. 4B illustrates an isometric view of the heatsink from FIG. 4A.

FIGS. 4A and 4B shows a heatsink 400 coupled to a heat source 402. In one embodiment, the heat source 402 includes a processor chip. The heatsink 400 includes a heat spreading base 410 with a first heat transfer device 420 and a second heat transfer device 430 coupled to the heat spreading base 410.

In one embodiment of the heatsink 400, the heat spreading base 410 includes a vapor chamber device. FIG. 4A illustrates a vapor chamber device having a vapor space 412 enclosed by a wall 414. The vapor chamber is effective at spreading heat from the heat source 402 substantially evenly over its length 416 to a top surface 418. Although a vapor chamber is shown in FIG. 4A, the invention is not so limited. Other heat spreading base embodiments such as solid composite heat spreading bases, high heat conducting solid metal bases, are also acceptable. One advantage of a vapor chamber is its inexpensive component price in comparison to its high heat spreading capabilities. Another advantage of a vapor chamber includes its thin profile in comparison to its high heat spreading capabilities.

In one embodiment of the heatsink 400, the first heat transfer device 420 includes a number of fins. In one embodiment, the first heat transfer device 420 includes a number of parallel plate fins. In one embodiment, the number of fins includes aluminum or copper metal fins. In one embodiment, alternative high surface area structures other than fins are used. In one embodiment, alternative materials to aluminum or copper such as other metals or high thermal conductivity materials are used. The first heat transfer device 420 is coupled to a portion of the top surface 418 of the heat spreader base 410. In one embodiment, a thermal interface material is used between the first heat transfer device 420 and the heat spreader base 410.

In one embodiment of the heatsink 400, the second heat transfer device 430 includes an active heat transfer device. In one embodiment, the second heat transfer device 430 includes a thermoelectric cooler (TEC). In one embodiment, the second heat transfer device 430 includes a solid state refrigeration or cooling device other than a TEC. In one embodiment, the second heat transfer device 430 includes a plurality of TEC devices stacked together. In one embodiment, an active heat transfer device includes a circulated medium such as a fluid that is pumped to actively move heat. In one embodiment, an active heat transfer device includes a circulated medium that is expanded to produce a cooling effect, and compressed in cycles, similar to an air conditioner. In the present description, an active heat transfer device is in contrast to a passive heat transfer device such as metal fins that rely primarily on thermal conducting properties of a solid material. In one embodiment, an active heat transfer device uses external energy such as electric current, a compressor, etc. to move more heat than a passive heat transfer device. Advantages of a TEC include low cost, high reliability and small size such as a small thickness that is compatible with IC environments.

In one embodiment, the second heat transfer device 430 includes a passive heat transfer component coupled to an active heat transfer component. As shown in FIGS. 4A and 4B, a heatsink 438 is coupled to a TEC 432. In one embodiment, the TEC includes a cold plate 434 and a hot plate 435 with a core material 432 such as Bismuth Telluride couples. In FIG. 4A, the heatsink 438 includes a number of fins. Similar to the first heat transfer device 420 described above, in one embodiment, the number of fins includes aluminum or copper metal fins, etc.

The first heat transfer device 420 includes a length 421 and the second heat transfer device 430 includes a length 431. In one embodiment, the first heat transfer device 420 and the second heat transfer device 430 are aligned with a fluid flow path 450. Although air is used as a cooling fluid in one embodiment, other gasses or liquids are also acceptable.

FIG. 4B shows an isometric view of the heatsink 400. A number of fins 423 from the first heat transfer device 420 are visible in the Figure, as are a number of fins 433 from the second heat transfer device 430. The TEC 432 is shown in this particular embodiment, coupled between the heatsink 438 and the heat spreading base 410.

Figure 5:
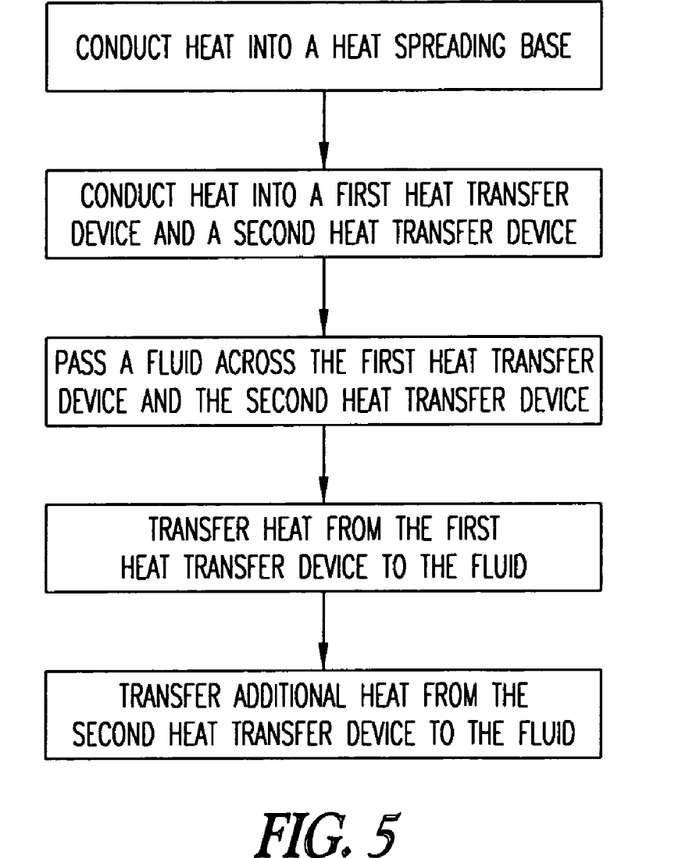
FIG. 5 illustrates a method of cooling according to an embodiment of the invention.

FIG. 5 shows a flow chart of one method of cooling a surface. Heat from the heat source 402 is conducted into the heat spreading base. The heat is then conducted into a first heat transfer device and a second heat transfer device. In one embodiment, the heat is concurrently conducted into the first heat transfer device and the second heat transfer device. A fluid such as air is passed over the first heat transfer device and the second heat transfer device. In one embodiment, air is passed over the first heat transfer device and the second heat transfer device in a linear succession. Heat is transferred from the first heat transfer device to the air. Heat is also transferred from the second heat transfer device to the air. In one embodiment heat is transferred to the first heat transfer device first, and to the second heat transfer device after transfer from the first heat transfer device. One embodiment of a method of heat transfer is further described below in reference to the device of FIG. 4.

In operation, the heat spreading base 410 spreads the heat from the heat source 402 substantially evenly over the top surface 418. The first heat transfer device 420 conducts heat away from the heat spreading base 410 in a first portion of the top surface 418. As air or other fluid passes over the first heat transfer device 420, the air is heated to a point where the heat transfer becomes less effective. The moving air is heated closer and closer to the temperature of the fins 423, and a point of diminishing return is reached where the heat transfer is substantially reduced due to the small differential temperature between the fins and the air. In one embodiment the point of diminishing return for the first heat transfer device 420 is determined by variables such the power dissipated by the heat source 402 and the speed of the fluid flow 450. In one embodiment, the first length 421 is chosen to be no longer than an effective length based on passive heat transfer conditions.

The second heat transfer device 430 also conducts heat away from the heat spreading base 410 in a second portion of the top surface 418. Because the second heat transfer device actively removes a portion of the heat from the heat spreading base 410, the second heat transfer device 430 is at a higher temperature than the first heat transfer device 420. This provides a larger differential in temperature between the outlet air 460 and the second heat transfer device 430 after the point of diminishing return for the first heat transfer device 420. The larger differential in temperature allows additional heat to be exchanged from the second heat transfer device 430, where a long heat sink with no active heat transfer device would be ineffective.

In one embodiment, the second length 431 is chosen based on a second point of diminishing return for the second heat transfer device 430. In one embodiment, fins 433 that are coupled to the TEC 432 of the second heat transfer device 430 have a limit of heat transfer after a certain length similar to the point of diminishing return discussed above with the first heat transfer device 420. In one embodiment, the second length 431 is chosen to be equal or less than the point of diminishing return. This provides an extra heat transfer path.

Several advantages are realized in embodiments of heatsinks as described above. Advantages include, the ability to dissipate additional heat due to the use of an active heat transfer device. Another advantage includes a thin profile active heat transfer device that is more reliable due to solid state construction. Combining a passive heat transfer device with an active heat transfer device has an advantage of dissipating a large amount of heat while maintaining reliability of components such as the TEC.

Embodiments as described above share the necessary heat transfer between the passive heat transfer device and the active heat transfer device, thus increasing the amount of heat dissipated while maintaining reliability of the individual components. Another advantage of embodiments described above includes an increased length of the heatsink which maintains a large temperature difference between heat transfer structures and the heat transfer fluid such as air. While a number of advantages of embodiments of the invention are described, the above list is not intended to be exhaustive.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of embodiments described above. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A heatsink, comprising:
   a heat spreading base;
   a first heat transfer device coupled to a first portion of the heat spreading base, the first heat transfer device having a first heat conduction rate; and
   a thermoelectric heat transfer device coupled to a second portion of the heat spreading base, the thermoelectric heat transfer device having a second heat conduction rate different from the first heat conduction rate.

2. The heatsink of claim 1, wherein the heat spreading base includes a vapor chamber base.

3. The heatsink of claim 1, wherein the first heat transfer device includes a number of parallel plate fins.

4. The heatsink of claim 1, wherein the thermoelectric heat transfer device includes a number of parallel plate fins coupled to the thermoelectric device.

5. The heatsink of claim 1, wherein the heat spreading base is positioned to align with a fluid flow path, wherein the first heat transfer device is located upstream, and the second heat transfer device is located downstream.

6. The heatsink of claim 5, wherein the fluid flow includes an airflow.

7. A heatsink, comprising:
   a vapor chamber base;
   a first number of heat transfer structures coupled to a first portion of the vapor chamber base;
   a thermoelectric cooler coupled to a second portion of the vapor chamber base; and
   a second number of heat transfer structures coupled to the thermoelectric cooler.

8. The heatsink of claim 7, wherein the first number of heat transfer structures includes a first number of parallel plate fins.

9. The heatsink of claim 7, wherein the second number of heat transfer structures includes a second number of parallel plate fins.

10. A processor assembly, comprising:
    a processor chip;
    a heatsink coupled to the processor chip, including:
       a heat spreading base;
       a first heat transfer device coupled to a first portion of the heat spreading base, the first heat transfer device having a first heat conduction rate; and
       a thermoelectric heat transfer device coupled to a second portion of the heat spreading base, the thermoelectric heat transfer device having a second heat conduction rate higher than the first heat conduction rate.

11. The processor assembly of claim 10, wherein the heat spreading base includes a vapor chamber base.

12. The processor assembly of claim 10, wherein the first heat transfer device includes a number of parallel plate fins.

13. The processor assembly of claim 10, wherein the thermoelectric heat transfer device includes a number of parallel plate fins coupled to the thermoelectric device.

14. An information handling system, comprising:
    a heatsink coupled to at least one logic chip, the heatsink including:
       a heat spreading base;
       a first heat transfer device coupled to a first portion of the heat spreading base, the first heat transfer device having a first heat conduction rate;
       a second heat transfer device coupled to a second portion of the heat spreading base, the second heat transfer device having a second heat conduction rate higher than the first heat conduction rate;
    wherein the heat spreading base is positioned to align with a fluid flow path, wherein the first heat transfer device is located upstream, and the second heat transfer device is located downstream; and
    a synchronous dynamic random access memory in communication with the logic chip.

15. The information handling system of claim 14, wherein the at least one logic chip includes a processor chip.

16. The information handling system of claim 14, wherein the synchronous dynamic random access memory includes a dual data rate memory.

17. A method of cooling an electronic device, comprising:
    conducting heat from the electronic device into a heat spreading base;
    conducting an first amount of heat from the heat spreading base into a first heat transfer device;
    conducting a second amount of heat greater than the first amount of heat from the heat spreading base into a second heat transfer device; and passing a fluid across the first heat transfer device, then across the second heat transfer device.

18. The method of claim 17, wherein conducting heat from the electronic device into a heat spreading base includes conducting heat from the electronic device into a vapor chamber base.

19. The method of claim 17, wherein conducting a second amount of heat greater than the first amount of heat includes conducting a second amount of heat using an active heat transfer device.

20. The method of claim 19, wherein conducting the second amount of heat using the active heat transfer device includes conducting the second amount of heat using a thermoelectric device.

21. The method of claim 17, wherein passing a fluid across the first heat transfer device, then across the second heat transfer device includes passing air across the first heat transfer device, then across the second heat transfer device.

22. A heatsink, comprising:
    a heat spreading base;
    a first heat transfer device coupled to a first portion of the heat spreading base, the first heat transfer device having a first heat conduction rate;
    a second heat transfer device coupled to a second portion of the heat spreading base, the second heat transfer device having a second heat conduction rate different from the first heat conduction rate; and
    wherein the heat spreading base is positioned to align with a fluid flow path, wherein the first heat transfer device is located upstream, and the second heat transfer device is located downstream.

23. The heatsink of claim 22, wherein the heat spreading base includes a vapor chamber base.

24. The heatsink of claim 22, wherein the first heat transfer device includes a number of parallel plate fins.

25. The heatsink of claim 22, wherein the second heat transfer device includes a thermoelectric device.

26. The heatsink of claim 25, wherein the second heat transfer device includes a number of parallel plate fins coupled to the thermoelectric device.

* * * * *